(12) United States Patent  (10) Patent No.: US 6,404,081 B1
Staffiere  (45) Date of Patent: *Jun. 11, 2002

(54) EMBEDDED BACKUP ENERGY STORAGE UNIT

(75) Inventor: Donald T. Staffiere, Amherst, NH (US)

(73) Assignee: Energenius, Inc. (CA)

( * ) Notice: Subject to any disclaimer, the term of this patent is extended or adjusted under 35 U.S.C. 154(b) by 0 days.

This patent is subject to a terminal disclaimer.

(21) Appl. No.: 09/637,291

(22) Filed: Aug. 11, 2000

Related U.S. Application Data

(63) Continuation of application No. 09/079,795, filed on May 15, 1998, now Pat. No. 6,137,192.

(51) Int. Cl.$^7$ .............................................. H01H 35/00
(52) U.S. Cl. ..................... 307/130; 307/66; 365/229; 174/255
(58) Field of Search ................. 307/112, 116, 307/125, 126, 130, 131, 139, 150, 64, 66; 361/78, 79, 311, 728, 736, 748, 760, 761–764; 174/52.1, 68.1, 255, 256, 260; 320/121, 126, 166; 365/226, 228, 229; 257/678, 684

(56) References Cited

U.S. PATENT DOCUMENTS

| | | | | |
|---|---|---|---|---|
| 4,381,458 A | * | 4/1983 | Anstey et al. | 307/66 |
| 4,451,742 A | | 5/1984 | Aswell | 307/66 |
| 4,675,538 A | * | 6/1987 | Epstein | 307/66 |
| 4,730,121 A | | 3/1988 | Lee et al. | 307/66 |
| 4,754,160 A | | 6/1988 | Ely | 307/64 |
| 5,019,468 A | | 5/1991 | Miyabayashi | 429/191 |
| 5,035,965 A | | 7/1991 | Sangyoji et al. | 429/124 |
| 5,058,075 A | | 10/1991 | Mizuta | 365/229 |
| 5,172,304 A | | 12/1992 | Ozawa et al. | 361/401 |
| 5,180,645 A | | 1/1993 | Moré | 429/127 |
| 5,294,829 A | | 3/1994 | Hundt | 257/678 |
| 5,307,318 A | | 4/1994 | Nemoto | 365/226 |
| 5,438,549 A | | 8/1995 | Levy | 365/229 |
| 5,500,562 A | * | 3/1996 | Kelley | 307/66 |
| 5,558,957 A | | 9/1996 | Datta et al. | 429/127 |
| 5,563,576 A | | 10/1996 | Drori et al. | 340/455 |
| 5,583,739 A | | 12/1996 | Vu et al. | 361/313 |
| 5,765,279 A | | 6/1998 | Moresco et al. | 29/840 |
| 5,905,365 A | * | 5/1999 | Yeh | 307/66 |

FOREIGN PATENT DOCUMENTS

| | | | | |
|---|---|---|---|---|
| EP | 0 287 863 | | 10/1988 | |
| EP | 0 451 500 | | 10/1991 | |
| EP | 0 604 044 | | 6/1994 | |
| EP | 0 813 355 | | 12/1997 | |
| GB | 2 255 450 | | 11/1992 | |
| GB | 2269494 A | * | 2/1994 | H02J/9/06 |

* cited by examiner

*Primary Examiner*—Fritz Fleming
(74) *Attorney, Agent, or Firm*—Locke Liddell & Sapp LLP

(57) ABSTRACT

A backup energy unit for an electrical device having a power source, an operational load, and containing a layered electrical device having a top exterior surface and a bottom exterior surface, such as an integrated chip or layered circuit board. The energy unit is made up of at least one energy storage device. This energy storage device is made up of a dielectric material and a first and a second electrical storage conducting layer. The dielectric material lies between the first and second electrical storage conducting layers. Further, the dielectric material exists between the top exterior surface and bottom exterior surface of the layered electrical device. The energy unit is further made up of a voltage detector to detect a potential level of the power source. When the voltage detector detects a power source disruption, that is when the potential level of the power source is below a first voltage state, it controls a switcher. This switcher disconnects the power source from the operational load and connects the energy storage device to the operational load when the voltage detector detects a power source disruption. Thus, when the power source is disrupted, the energy storage device provides electrical power to the operational load.

55 Claims, 6 Drawing Sheets

EMBEDDED BACKUP ENERGY STORAGE UNIT

This application is a continuation of Ser. No. 09/079,795 May 15, 1998 U.S. Pat. No. 6,137,192.

The present invention is directed to the formation of energy storage devices on layered electrical devices, including printed circuit boards, integrated circuit chips, and other electrical devices made in layers. The invention is specifically directed to embedded backup energy storage devices contained within such devices.

BACKGROUND OF THE INVENTION

Many electrical devices are currently run with the use of layered electrical storage devices, such as integrated circuit chips and printed circuit boards. However, when the outside electrical source to these devices is disrupted, the operation of these devices ceases. Needless to say, is usually detrimental the entire purpose for operating the device.

A typical example is the modern digital alarm clock. Presently, most alarm clocks are run by a household current. A printed circuit board containing integrated circuit chips usually drives all the functions of the clock, including keeping track of the time and the alarm times. When there is a disruption of the current to the alarm clock, all this information is lost. The current time, the time the alarm is set for, and numerous other pieces of information are lost even during the minutest disruption in the normal power supply. It is not good to awaken in the morning to a blinking alarm clock that has not gone off at the proper time due to a minor power outage during the evening or early morning hours.

In addition to a compete power failure, these problems occur when a "brown-out" situation occurs. The main power to an appliance falls beneath a critical threshold at which the appliance operates in a predictable manner. In addition, "brown out" situations can actually harm the electronic components in these devices.

It is necessary that alternate electrical power be supplied to the critical functions of these devices. By supplying backup power to loads requiring electrical energy for continued operation, operational loads of the electric appliance or device, predictable operation for the electrical device is ensured. Further, damage to operational loads is decreased when an alternate power supply is available.

A solution to this problem is to buy a dedicated backup power supply. Such power supplies are common for critical electrical devices, including computers. However, the size and complexity of backup power supplies makes these devices impracticable for common household electronics consuming low amounts of electrical energy, such as an alarm clock.

Another solution is to add a common electrochemical battery to the appliance. However, the electrochemical backup battery adds a great deal of space and volume to any electrical appliance and is usually not worth the space expended. What is needed is a compact, easily manufactured, energy storage device for detecting a loss or drop of a power supply potential and maintaining critical functions of an electrical device during such a loss or drop of power supply potential.

It is desirable that any backup power supply be contained within or integral to a layered electrical device within a piece of common electronic equipment. Modularity and ease of manufacture dictate that a backup power supply be small enough to fit in the texture of any small electronic device. Thus, as stated before, many common backup electric power supplies cannot be utilized. Further, it is advantageous to put the backup power supply within or integral to the board or chip rather than connect it as a discrete component for several reasons. This backup power supply should be an electric storage device, or an electric energy source, embedded in the fabric of the electric device.

Usually, the volume consumed by a layered electrical device or assembly, such as a printed circuit board, or integrated circuit chip, is a very valuable commodity in the design of an electronic assembly device. The volume of the assembly dictates the number, size, and placement of components on it. In addition, with the advent of personal computers, a major limitation is in the space available for components to exist above the actual device surface. For example, minimization of the space used above the actual device represents a minimization of volume used for a system of printed circuit boards connected to a common bus, and thus maximizing the use for that volume.

The area of a surface consumed by mounted devices on a circuit board is also a very valuable commodity. Therefore, to reduce the surface area used by a mounted device lets the designer use that much more surface area for additional functional devices. Specifically, if one could redesign a circuit board with all the electric storage devices embedded within the board, a designer could use much more surface area for additional functional devices on that circuit board. Or, the designer could reduce the entire assembly size.

Similarly, if an integrated circuit chip (IC chip) could embed smaller, more powerful electric storage devices within the layers making up the chip, more volume of the chip could be dedicated to other functional purposes.

Typically, in a printed circuit board, the design of the circuitry requires some sort of energy storage device, such as a capacitor or battery. The designer usually chooses a discrete component for such a storage device in the circuit. This discrete component occupies surface area of the board and an amount of volume in and above the board.

During the printed circuit board manufacturing process, the spot where the energy storage device is to be placed is left blank for attachment later. Usually, a manufacturer manufactures the circuit board with holes placed where the leads of the storage device will be attached. Later, a discrete electrical storage device, such as a battery or capacitor, is placed into the circuit and electrically attached to the circuit board with a secondary interconnection such as a screw on contact or soldered joint. Usually, the circuit connections are terminated at the hole where the storage device leads will be placed, and when the storage device leads are guided into the hole, this completes the circuit path.

However, using discrete electrical storage device components has several drawbacks. One main drawback is that most of the electrical storage device components and the necessities for their connection to the circuit take up valuable surface area on and occupy volume in and above the board.

With respect to IC chips, large electrical storage devices are impracticable. First, an IC chip usually does not have any interconnections to discrete devices through its surface. Second, the small volume of a chip does not lend itself to large or medium electrical storage devices.

Generally, energy storage devices in particular require large areas and volumes, and tend to tower above other components on a board. Even smaller energy storage devices on a circuit board can be the tallest components on a board. These devices present design problems due to placement, and take up valuable board surface area and volume.

The equation (k×A)/T defines the capacitance of an energy storage device, or a measure of the amount of electric charge it can hold. In the equation, k stands for the dielectric constant of the material between two opposite charged plates, A being the area of the smallest plate, and T being the thickness of the dielectric material. Thus, small volumes and areas, without a high dielectric constant, make smaller capacitances. For very small volumes and areas, such as in an IC chip, large storage devices are impracticable due to space limitations and the fact that most IC chips do not provide for a surface interconnection to other discrete components.

If a design requires a larger energy storage device in a particular, the problem is amplified further. A larger storage device tends to require a larger area and volume to house the discrete component. Usually, for printed circuit boards, the solution is to place the capacitors where they extend outward from the board.

An example of the space needed for energy storage can be shown in the context of a power supply, where the functional components can take up about 30% of a board's space. A need exists for backup electric energy storage devices contained in the fabric of the layered electrical device. This backup electric storage device would go on when power is cut to the layered electrical device to make sure that during a minor power cut, no information is lost in that brief moment. A discrete interconnected storage device for common appliances, such as a modern digital alarm clock, is impracticable due to space and cost limitations.

Further, several problems exists when a discrete storage device must be interconnected into the circuit board. Usually, a manufacturer must solder all components into a connection to the circuit in the printed circuit board. This interconnection is a weak point and the cause of many failures in printed circuit board packages. The interconnection is also a point where manufacturing mistakes can occur. Thus, an energy storage device integrated directly into the layers of a layered electrical device, such as a printed circuit board or IC chip, is very valuable. If the energy storage device is integral to the the layered electrical device, that is formed as part of the layered electrical device and not added in later stages, this improves the reliability of the device and is therefore beneficial to overall performance.

In an integrated circuit chip, the spaces involved are so small that significant energy storage is not possible. The only place to put any energy storage device is in the substrate comprising the integrated circuit chip. Thus significant energy storage, as a battery or capacitor, is untenable for these devices.

What is needed is an apparatus in which the energy storage device components do not take up area on the surface of and volume above a layered electrical device. If this could be achieved, this would free up valuable area for the placement of components and free up the volume used by discrete components. In addition, an integrated electrical energy storage device formed in the substrates of an IC chip could greatly enhance the functionality of that chip. Further, an integrated energy storage device in a layered electrical device is needed to enhance semiconductor performance, since it eliminates some soldered connections. Further, the energy storage device must provide the functionality of switching on its stored electrical energy when the normal power supply has been cut off.

SUMMARY OF THE INVENTION

The current invention involves a backup energy storage device which resides in the layers of a layered electrical device. The invention is directed to an apparatus by which the energy storage device components do not take up area or volumes on the surfaces on a layered electrical device such as an IC chip or printed circuit board.

In a preferred embodiment, the layered electrical device manufacturer embeds the energy storage device in the strata that make up the layered electrical device. A high energy storage dielectric is sandwiched between two electrical conducting layers and is contained completely within the layered electrical device. At least one of the electrical conducting layers around the high storage dielectric is etched or formed to the parameters necessary to establish the value for the energy storage device. A manufacturer etches or forms the layer according to the technologies inherent in the semiconductor device processes, integrated chip manufacturing techniques, or printed circuit board techniques.

In a preferred embodiment, a manufacturer makes up the layered electrical device of from layers or substrates. The layered electrical device would contain in its assembly a pair of electrical conducting layers sandwiching a high energy storage capacity dielectric. The first conducting layer would be formed to provide the appropriately shaped and sized plate for the electrical storage device, such as a battery or capacitor.

In one alternative, second conducting layer would remain unchanged. Here, all the energy storage devices defined by the two conducting layers and the dielectric layer would need a similar voltage level at the lead defined by the second conducting layer.

In another embodiment, the areas in the second conducting layer would be electrically isolated from one another. This would serve to form independent leads for each energy storage device defined by the two conducting layers and the dielectric layer. A designer could make appropriate connections to several different voltages for each energy storage device from the now independent leads. In yet another embodiment, one conducting layer could also act as a thermal heat sink for the layered electrical device.

The invention replaces a common electrochemical backup energy storage device with a solid state energy storage device composed of conducting plated and a high dielectric constant dielectric. The dielectric should have a dielectric constant of at least 50, and preferably one of at least 100.

Thus, a designer or manufacturer may form high energy storage capacitors or batteries internally to the chip or board. This internal manufacturing reduces interconnections, a root of many manufacturing flaws. The high capacity dielectric also gives the capability for higher capacity capacitors and batteries internal to a layered electrical device, thus freeing up valuable area and volume on and in a layered electrical device. The high capacity dielectric also enables the energy storage device to store enough energy to be used as a backup storage device.

An energy supply unit comprises an energy storage device formed in the layers of a layered electrical device as recited above. A voltage detector detects the potential level of the outside power source. When the voltage detector detects that the electric potential of the power source is below a first voltage state, indicating a power disruption such as a failure or brown out, it triggers a switcher.

The voltage detector controls the switcher by signaling the presence of a power disruption. The switcher disconnects the power source from the operational load when the voltage detector detects and indicates a power disruption at the power source. The switcher also connects the energy storage device to the operational load. The energy storage device then provides electrical power to the operational load when the power source has some sort of disruption, such as a failure or brown out.

DETAILED DESCRIPTION OF THE INVENTION

A voltage detector is connected to the main power supply. The voltage detector detects when the power supply potential falls below a potential level indicating a power supply disruption. The voltage detector indicates this state to a switcher. The switcher is connected to operational loads in an electrical appliance, the main power supply, and the backup energy storage device. The switching device is connected to a signal from the voltage detector indicating a power supply disruption, such as a failure or brown out. When the voltage detector detects and signals the presence of a power supply disruption, the switcher switches the power from which the operational load is drawing from the main power supply to the backup energy storage device. This reverses when the voltage detector detects and signals a return of the power supply potential to a normal level.

The energy storage device is linked to the operational load through the switching device. Thus when something disrupts the main power supply, the backup energy storage device provides electrical energy to the operational load. It can also use the main power supply to recharge itself for the next power disruption.

The current invention describes an apparatus by which backup energy storage devices are integrated into a layered electrical device, such as an IC chip or printed circuit board, without the need for secondary interconnections. Thus the energy storage device need not be a separate discrete device formed apart from the layered electrical device and added at a later manufacturing stage. Instead, a manufacturer would form the energy storage device as an integral part of a layered electrical device. Secondly, the energy storage device takes a minimum of area on the surface and volume of a layered electrical device.

Figure 1:
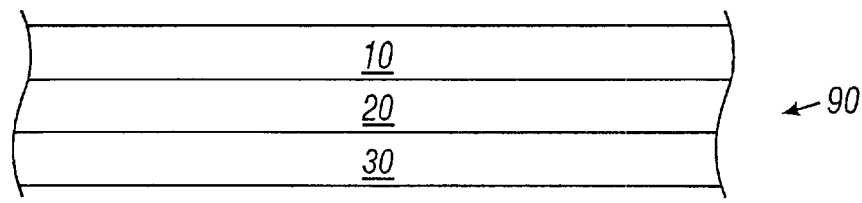
FIG. 1 is a cut away view of an integrated circuit chip.
Figure 2:
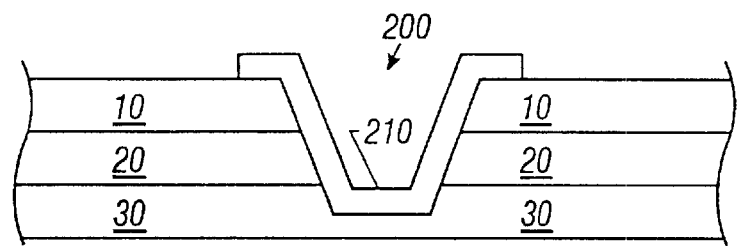
FIG. 2 is a cut away view of an electrical connection between the layers of an integrated circuit chip.

As shown in FIG. 1, an integrated circuit chip 90 is made with layers of conducting 10, non-conducting 20, and semi-conducting 30 materials. Circuits are formed in the chip by forming channels 200, called "vias", in the substrates, as shown in FIG. 2. These channels may be carved using mechanical etching, x-ray lithography, or many other processes well known in the art. Laying down thin films of an electric conductor 210 electrically connects the vias to another layer. Further, to maximize the volume used, many layered electrical devices are formed in layers and bonded together to form the final product.

All energy storage devices, such as batteries, may not have high energy storage capability, due to the limited volume of the materials and the low dielectric constants of most materials used in the chip. Thus, because of area and volume limitations, designing a layered electrical device with energy storage devices capable of storing a significant amount of energy is impracticable. Further, in most integrated circuit chips, no energy storage device can reside above it, as with a printed circuit board having external connections for discrete devices. This is because an integrated circuit chip usually does not allow for interconnections on the surfaces of the chip.

Figure 3:
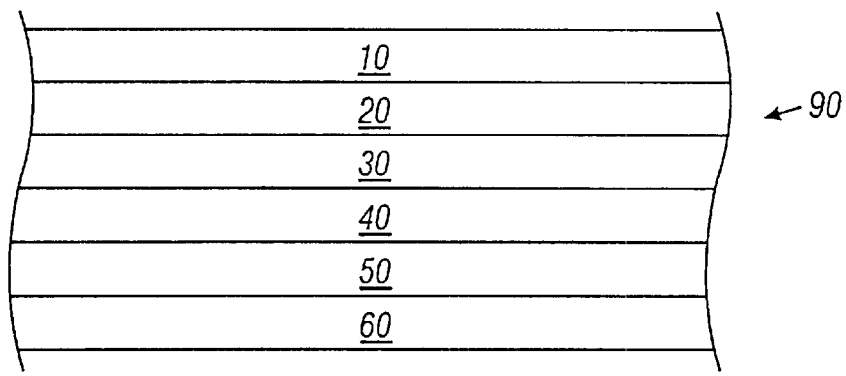
FIG. 3 is a cut away view of the stratums making up an integrated circuit chip of th.

In an embodiment of the invention, shown in FIG. 3, an integrated circuit chip 90 contains additional substrates 40, 50, and 60. These substrates comprise a high storage capacity dielectric material 50 sandwiched between two electric conducting substrates 40 and 60.

Figure 4:
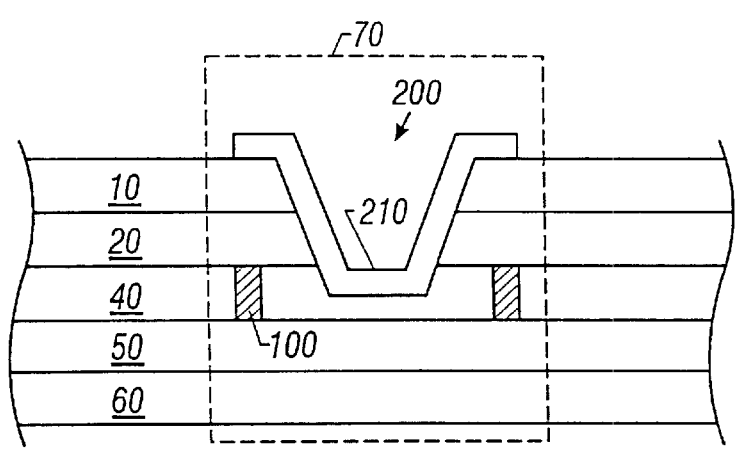
FIG. 4 is a cut away view of an electrical storage device on an integrated circuit chip.

Referring to FIG. 4, to form an energy storage device such as capacitor 70 in the layered assembly, one needs only to figure out the proper capacitance required. With a given dielectric material, and the material having a known thickness, one only needs compute the area of conducting substrate 40 to define and form conducting plate 100 that corresponds to the required energy storage or capacitance.

Figure 4A:
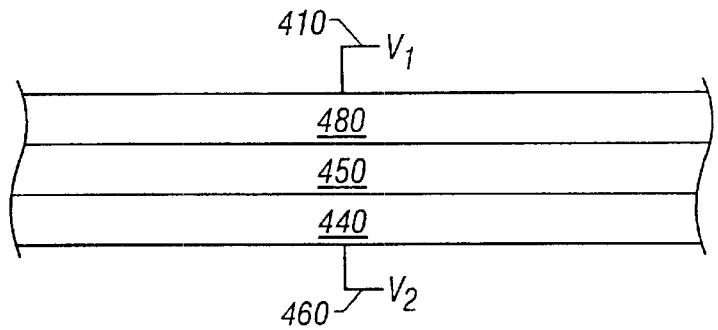
FIGS. 4a and 4b are a cut away view of a classical electrical energy storage device.

The structure of a classic capacitor is shown in FIG. 4a, and comprises two electrical conducting plates 480 and 440 sandwiching a dielectric layer 450. Electrical conducting layers 480 and 440 are connected to voltages 410 and 460. It should be noted that capacitor 70 in FIG. 4 may have this structure. If a voltage is applied to layer 10, and a voltage applied to layer 60, the full capacitor structure is present. It should be further noted that one can easily apply this same layered structure to implement a battery as well.

Figure 4B:
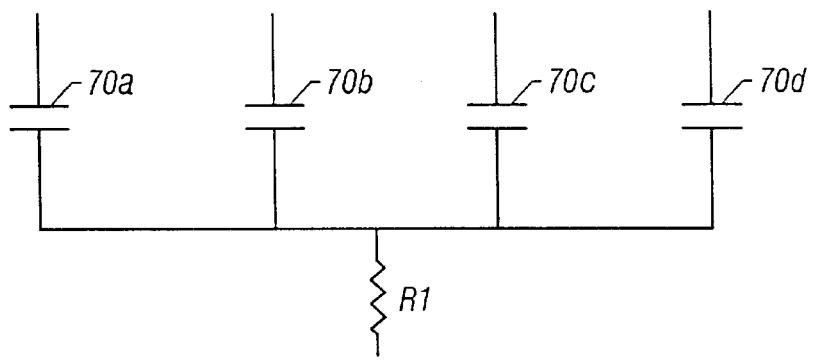

It should also be noted that, as illustrated in FIG. 4b, one can increase the available stored electric energy by combining a group of electric energy storage device. This is accomplished in FIG. 4b by connecting in parallel energy storage devices 70a, 70b, 70c, and 70d. Further, resistance R1 is added to the output of energy storage devices 70a, 70b, 70c, and 70d. Resistance R1 is added is to regulate the flow of electric energy from storage devices 70a, 70b, 70c, and 70d, and is in fact a preferred way of implementing a storage device of this nature.

Figure 5:
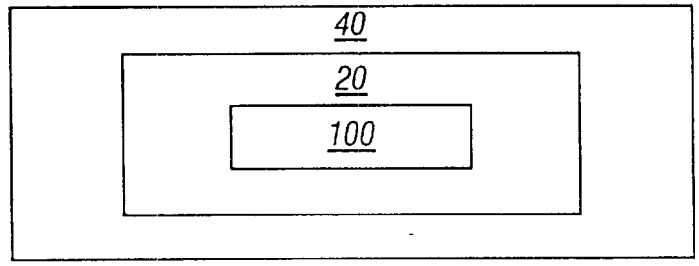
FIG. 5 is a cut away planar view of the bottom of the formation of a conducting plate.

To make an energy storage device within a layered electrical device, the designer or manufacturer determines a proper spot for where the electric storage device 70 is to reside, and conducting plate 100 is electrically isolated from the rest of substrate 40, as shown in FIGS. 4 and 5. "Via" 200 then electrically connects substrate 40 to substrate 10. This forms a capacitor embedded within a layered electrical device by shaping and using substrates 40, 50, and 60.

Figure 6:
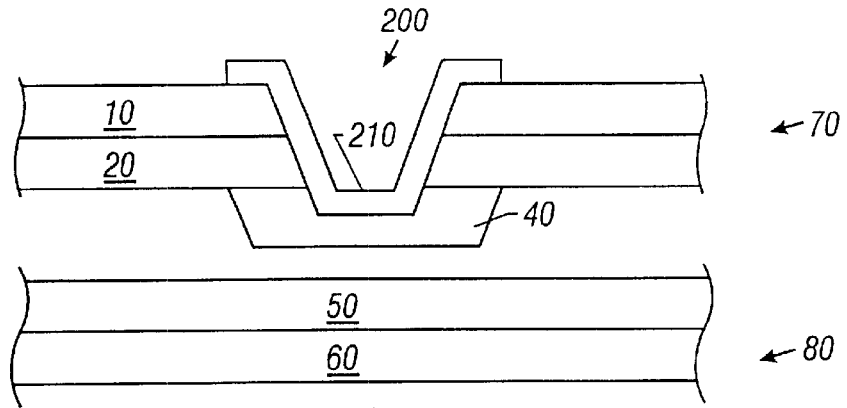
FIG. 6 is a cut away side view of an emedded energy storage device on an integrated circuit chip.
Figure 7:
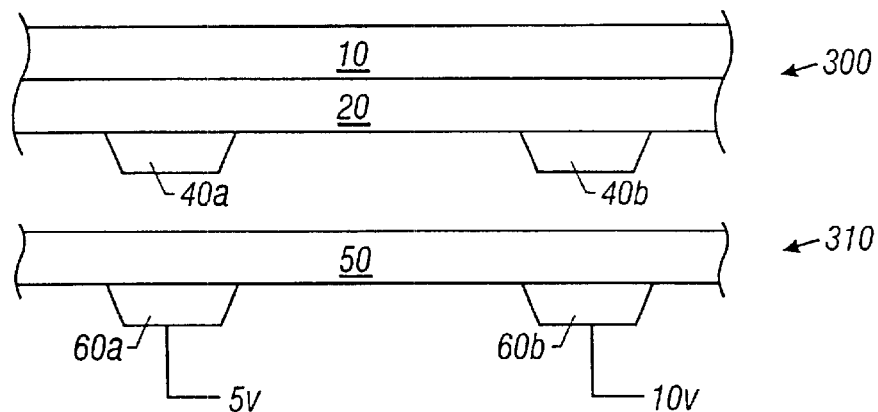
FIG. 7 is a cut away view of another emedded energy storage device on an integrated circuit chip.

FIGS. 6 and 7 show one alternative for forming an energy storage device. Substrate 40 is initially formed on substrate 20, and altered via conventional chip making techniques for the proper size, shape, and position, and ready to be bonded to a wafer 80 of dielectric material 50 and electrical conducting layer 60. A practitioner can do this by any way known in the prior art. In one embodiment of the embedded energy device shown in FIG. 7, one preforms substrate 60 so that each electrically segregated area on substrate 60, 60a and 60b, can connect to different voltages. Alternatively, as shown in FIG. 6, one need not alter substrate 60. Here one could tie each capacitor or other energy storage device to the same voltage level via substrate 60.

Figure 8:
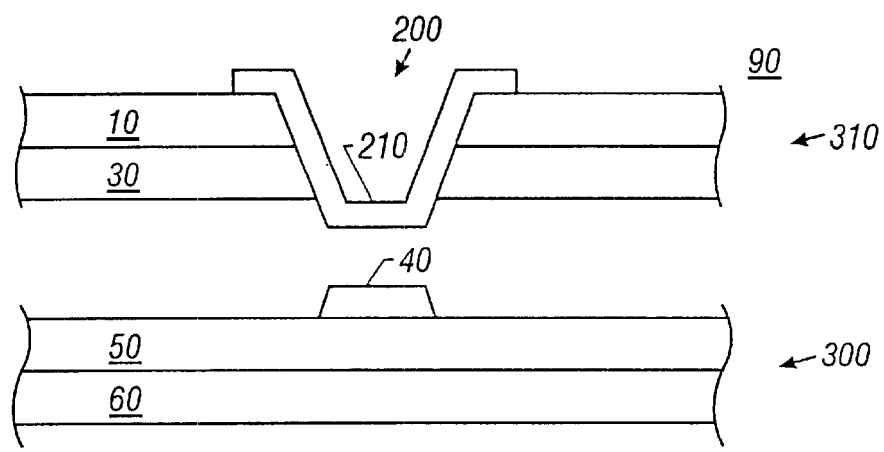
FIG. 8 is a cut away view of an emedded energy storage device on an integrated circuit chip.

Or, as shown in FIG. 8, one could form substrates 40, 50, and 60 as a unit. One then alters substrates 40 and 60 for the proper size, shape, and position, and then bonds these to chip 90 via conventional integrated circuit chip manufacturing techniques. One should note that one need not etch layers 40 and 60 down off of dielectric layer 50. One could build these layers up on dielectric layer 50 in the proper shape, size, position, and area. After bonding together subparts 300 and 310, making "via" 200 would form the electrical connection between electric conducting substrates 10 and 40 as described previously. One should note that via 200 may be made previously to bonding. This would then connect the electric storage device to the rest of the circuit.

It is crucial that the dielectric constant of dielectric material 50 is as high as possible to reduce the area needed for an electric conductor. The dielectric material should have a dielectric constant of at least 50, and preferably should be at least 100 or better. Having this high storage capacity for is crucial for two reasons. First, one can form small and medium sized energy storage devices with a least amount of area and use volume within a layered electrical device. Second, for higher order energy storage devices, until now not realizable with prior art materials on an integrated circuit chip, higher electric storage capacity is necessary. One easily achieves a higher electric storage capacity with a composition having a higher dielectric constant. The higher the dielectric constant, the more energy storage a given battery formed from the material will store. Thus, more electric energy is available with a high dielectric constant material 50.

Preferred dielectric materials for use in the embedded energy device include those found in U.S. patent application Ser. No. 08/911,716 filed August, 1997, entitled SEMICONDUCTOR SUPERCAPACITOR SYSTEM AND METHOD FOR MAKING SAME, herein incorporated by reference. Particularly preferred is a thin film of the formula Ba(a)Ti(b)O(c) wherein a and b are independently between 0.75 and 1.25 and c is between about 2.5 and about 5.0. Another dielectric material 50 that can be used in the embedded energy device is a thin film of the formula M(d)Ba(a)Ti(b)O(c) wherein "M" is Au, Cu, Ni(3)Al, Ru, or InSn, and wherein a and b are independently between 0.75 and 1.25 and c is between about 2.5 to about 5.0 and d is about 0.01 to 0.25.

The conducting substrates 40 and 60 can be an electrical conductor, such as copper as silver. The preferred embodiment would have copper as the electrical conductor, due to the thermal and electrical characteristics it has.

Several thin film deposition techniques can deposit the previously named dielectric on the conducting substrate, such as a sol-gel process, sputtering, or chemical vapor technologies.

Figure 9:
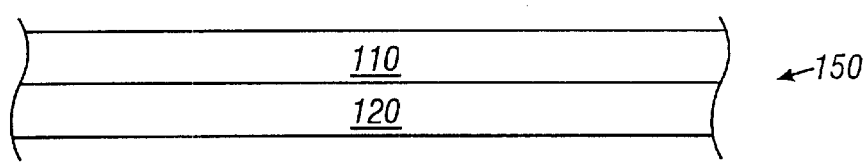
FIG. 9 is a cut away view of a blank printed circuit board.
Figure 10:
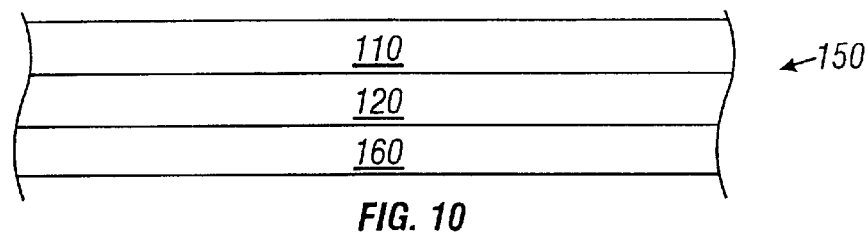
FIG. 10 is a cut away view of a double sided blank printed circuit board.

In yet another embodiment of the embedded energy device, the same technology could be used in the manufacture of printed circuit boards. Printed circuit boards typically have the same substrate structure of integrated circuit chips, but the layers have differing compositions for different purposes. As shown in FIG. 9, a printed circuit board 150 contains a top layer of conducting material 110, such as copper, laid over non-conducting layer 120, such as fiberglass. To make the circuit patterns, a photo resist pattern is silkscreened onto conducting layer 110, and board 150 is acid washed. This removes all of conducting material 110 except the portions protected by the silkscreened photo resist. One should note that board 150 can contain a second layer of conducting material 160 on the bottom, as shown in FIG. 10, and the process for making the circuit pattern in this case is the same.

Figure 11:
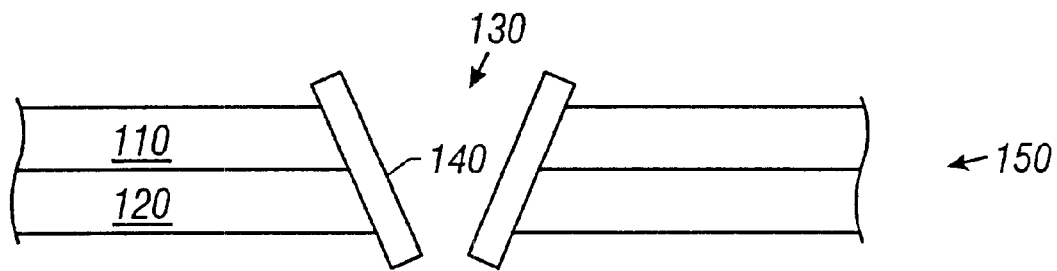
FIG. 11 is a cut away view of a printed circuit board showing a via and its structure.

Thus, circuit board 150 has a makeup such as depicted in FIG. 11, with conducting material 110 overlaying in certain places substrate 120. One drills plate holes 130 in the board for the various discrete electrical components, such as integrated circuit chips, resistors, and capacitors. One then lines hole 130 with electrical conducting material 140, making a "via" for the printed circuit board. This ensures electrical contact between the discrete devices placed on the board in the holes and the etched circuit pattern defined by conducting material 110 on the surface of board 150. This technique can also be used to connect two electrical conducting layers 110 separated by a non-conducting layer 120.

Figure 12:
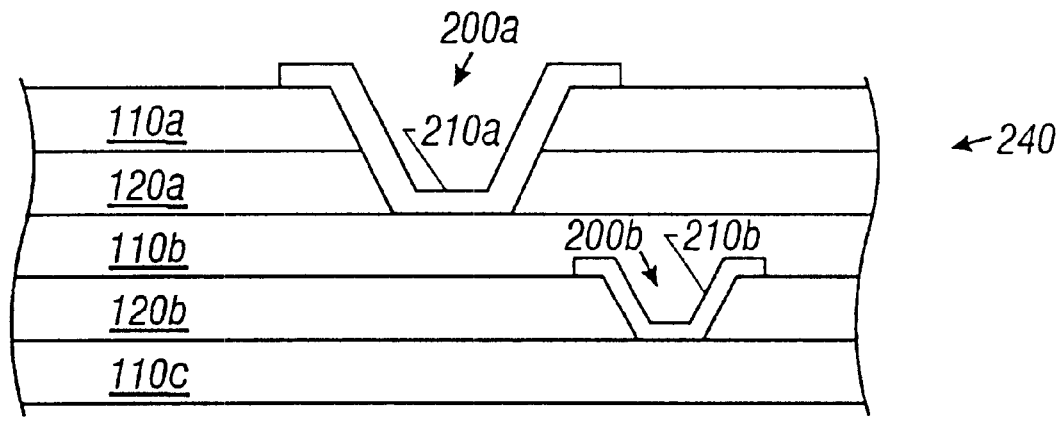
FIG. 12 is a cut away view of a printed circuit board made up of many layers.

One can bond several layers together, and make electrical contacts through one level to another, such as making "vias" through the top board to the second. Thus, one can form multi-layer circuits, as shown by multi-layer board 240, conducting layers 110a, 110b, and 110c, "vias" 200a and 200b, and non-conducting layers 120a, and 120b in FIG. 12. In the embodiments of the embedded energy device dealing with circuit boards, a photo resist silkscreen is laid on conducting material 110 of a board in the shape, area, and place, for the capacitor having a capacitance for a given dielectric constant and dielectric thickness.

Figure 13:
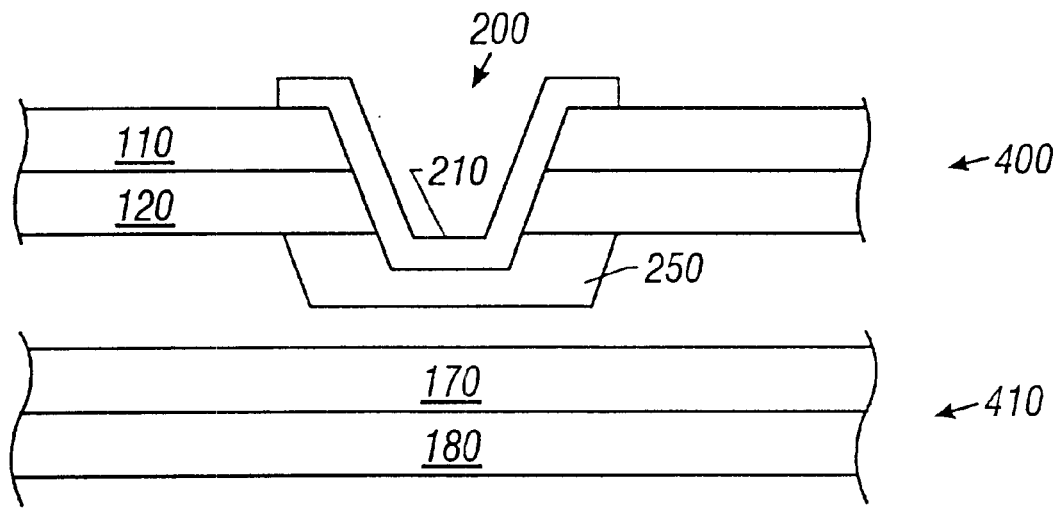
FIG. 13 is a cut away view of an emedded energy storage device showing the structure in a printed circuit board.

FIG. 13 shows conducting layer 110 and nonconducting layer 120 with via 200 connecting layer 110 it to conducting layer 250. One etches or forms electrical conducting layer 250 to form the area and shape required for an electrical energy storage device. A wafer 410 comprising a layer of dielectric material 170 with underlying electrical conducting material 180 is bonded to wafer 400 at shaped conducting layer 250, thus forming an electrical storage device confined within the resulting board.

Figure 13A:
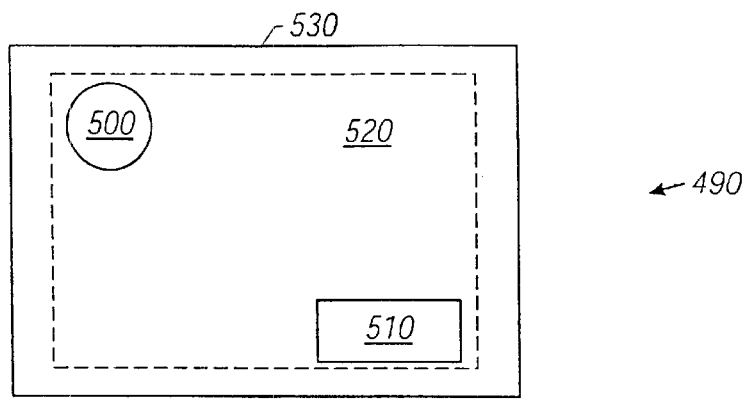
FIG. 13a is a bottom view of a printed circuit board making up an embedded energy storage device.

Turning to FIG. 13a, the bottom conducting layer of a two sided circuit assembly 490 has been etched to make conducting plates 500 and 510. Non-conducting circuit board layer 520 surrounds conducting plates 500 and 510. Ghost image 530 shows the area on board 490 where a layer of dielectric material will contact board 490. Note that this area includes conducting plates 500 and 510.

Figure 13B:
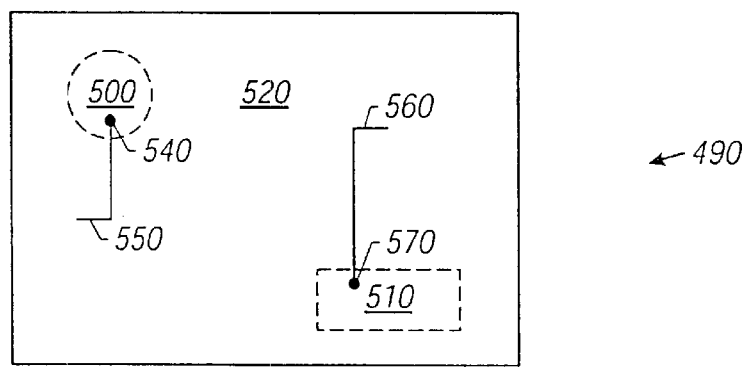
FIG. 13b is a top view of a printed circuit board making up an embedded energy storage device.

FIG. 13b is a top view of the same two sided circuit assembly depicted in FIG. 13a. Ghost images 500 and 510 depict the area on the opposite side of board 490 where the conducting plates 500 and 510 have been formed. Electric conducting wires 550 and 560 have been formed, and are isolated from one another by non-conducting layer 520. Vias 540 and 570 electrically connect plates 500 and 510 to wires 550 and 560, respectively.

Figure 13C:
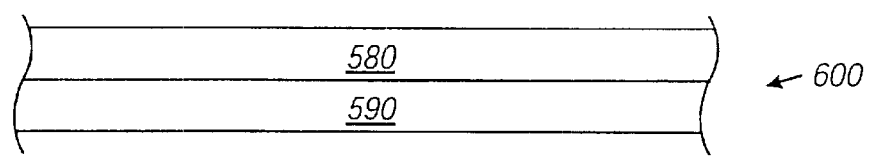
FIG. 13c is a side view of a printed circuit board making up an embedded energy storage device.

FIG. 13c is a cross section of assembly 600 which is to be attached to assembly 490. Assembly 600 comprises an electrically conducting heat spreader 590 with an area of a thin film dielectric material 580 placed on it. Dielectric layer 580 is placed in contact with plates 500 and 510, depicted in FIG. 13a. When attached to assembly 490, conducting plates 500 and 510, together with dielectric volume 540, and copper heat spreader 550 form a pair of electric storage devices. Any connections out of these storage devices can be routed to a resistor in order to more precisely regulate the flow of electric energy to the rest of an attached circuit.

Figure 14:
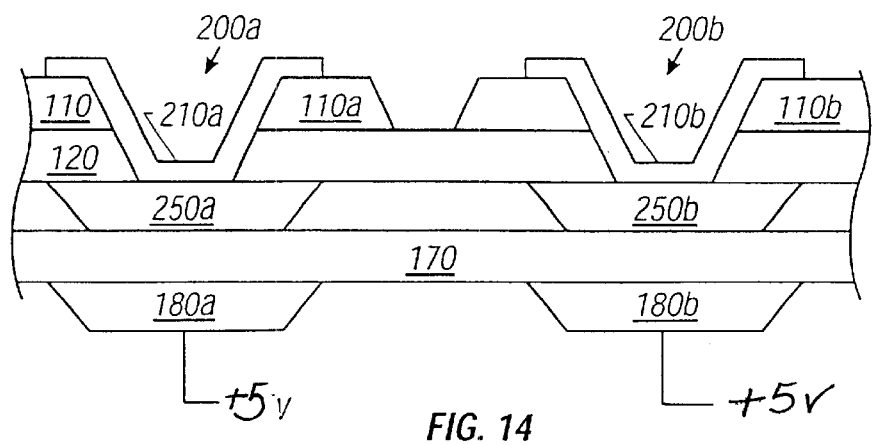
FIG. 14 is a cut away view of another embedded energy storage device showing the structure in a printed circuit board with multiple leads and voltages.

One should note that electrical conducting layer 180 can itself be formed so that one can tie different components to different voltages, as shown in FIG. 14. FIG. 14 shows electrical layer 180a and electrical layer 180b connected to two possibly different voltages, and also connected to two different electrical inputs through electrical layers 110a and 110b, respectively. Or, as shown in FIG. 13, electrical conducting layer 180 need not be altered, thus providing a common voltage for all the electrical storage components formed out of electrical conducting layer 110 and dielectric layer 170.

With an appropriately high dielectric constant material comprising dielectric material layer 170, one can make energy storage devices in the interior of the printed circuit board. This greatly reduces the risks of failing interconnections, and saves valuable area on the surface of and volume off the board for more discrete components such as, for example, chips and resistors, to name but a few. The electric storage devices according to the current embedded energy device would also serve to reduce the area and volume of a layered electrical device.

In the preferred embodiment, shown in FIG. 13, the resulting circuit board will have an electrical conducting layer 180 that also serves as a heat spreader. Thus, the heat spreader and conducting layer could become a similar voltage level, such as ground, for the components made from dielectric layer 170 and conducting layer 110. One then utilizes the heat spreader to perform double duty, thus increasing the spatial effectiveness of the circuit board.

Figure 15:
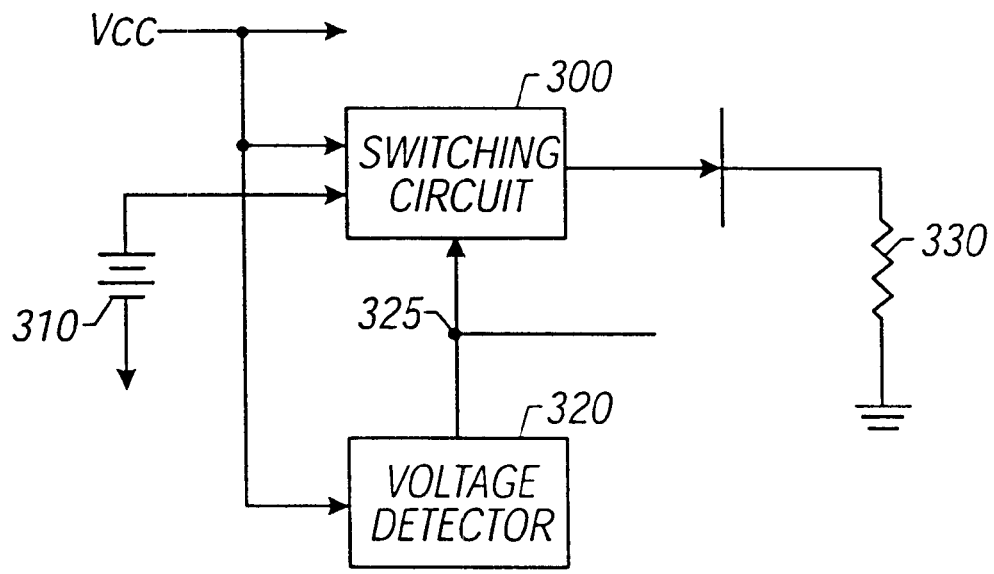
FIG. 15 is a system block diagram of a device for detecting a power loss and maintaining a constant power supply to critical functions.

FIG. 15 shows a schematic of how the embedded electrical energy storage device would be implemented in a circuit within the layered electrical device, forming an electrical storage unit according to the invention. A switching circuit 300 is coupled to embedded backup electrical energy storage device 310. Switching circuit 300 is also coupled to the main power potential Vcc. Vcc is connected to a voltage detector circuit 320.

When Vcc drops below a minimum potential, voltage detector circuit 320 signals switching circuit 310 of such a condition via signal line 325. In response to the signal generated by voltage detector 320, switching circuit 300 disconnects Vcc from the rest of the load and connects to embedded electrical energy storage device 310 to the load. This allows the load to be run off electrical energy stored in embedded storage device 310. Thus, a power outage or disruption of Vcc does not result in the loss of operation of load 330.

Correspondingly, when Vcc rises to the normal level, voltage detector 320 deasserts the signal to switching circuitry 300. Thus, when Vcc indicates normal operation by having a potential above a certain voltage, switching circuitry 300 then disconnects embedded backup electrical energy storage device 310 from load 330, and connects Vcc to load 330.

Figure 16:
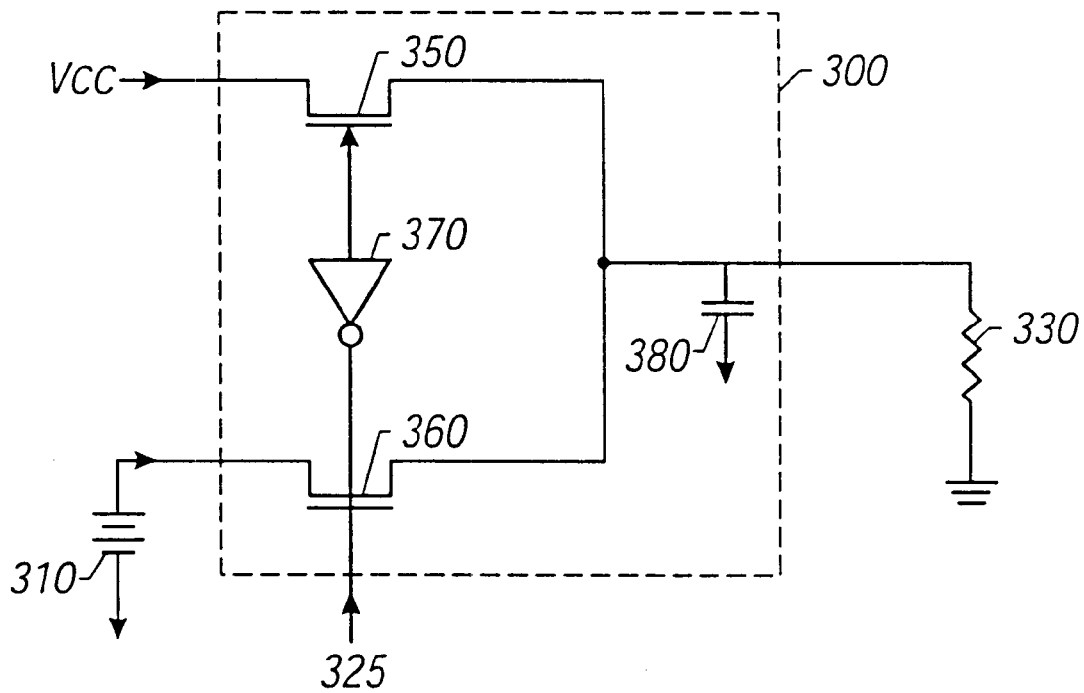
FIG. 16 is a schematic of a switching circuit for maintaining a constant power supply to critical functions.

It should be noted that embedded backup electrical energy storage device 310 can be connected to Vcc, as shown in the embodiment detailed in FIG. 16. When Vcc is present across the nodes of embedded backup electrical energy storage device 310, it recharges off Vcc.

Referring to FIG. 17, an example of switching circuit 300 is detailed. Switching circuit 300 include two field effect transistors 350 and 360. These transistors can be both N-type transistors, or both be P-type transistors. Transistors 350 and 360 are both switching transistors.

Transistor 350 has its drain coupled to the Vcc power supply and its source coupled to output load 330. The gate of transistor 350 is coupled to receive the signal from voltage detector 320 via an inverter 370. Transistor 360 has its drain coupled to embedded backup electrical energy storage device 310 and its source coupled to load 330. The gate of transistor 360 is coupled to receive signal 325 from voltage detector 320.

As can be seen from FIG. 16, transistors 350 and 360 are alternatively turned on by signal 325 from voltage detector 320. When voltage detector 320 detects Vcc has dropped, signal 325 switches transistor 360 on and transistor 350 off. This couples backup energy storage device 310 with load 300. Alternatively, when voltage detector 320 detects Vcc above a minimum threshold, signal 325 switches transistor 350 on and 360 off. This couples Vcc with load 300.

It is possible that slight mistiming may occur between switching on of transistor 350 and the switching off of transistor 360, and vice versa. The use of capacitor 380 in switching circuit 300 is to smooth out glitches that may occur at load 330 when these transitions take place.

Voltage detector 320 can be any kind of known voltage detector. Embedded backup electrical energy storage device 310 is constructed as in the fashion described above.

It should be noted in this discussion, that Vcc is a DC power supply. While most appliances use AC power, most electrical devices transform this AC current and voltage to a DC current and voltage before the main load. When the household AC electricity drops, so does the derived DC voltage. Thus, Vcc will drop when the household AC current drops.

It should be noted that in all embodiments, the backup energy storage device will exist as an integral part of the resulting layered electrical device contained as part of the electrical appliance. In the case of a circuit board, the final layered electrical device may have as part of one of its exterior surfaces one of the electrical storage device's conducting layers. In this case, the storage device would be partially embedded in the layered electrical device. In other embodiments, the electrical storage device would be fully embedded within the final layered electrical device.

Various modifications may be made in the nature, composition, operation and arrangement of the various elements, steps and procedures described herein without departing from the spirit and scope of the invention as defined in the following claims.

I claim:

1. An energy unit for an electrical device, the electrical device having a power source and an operational load, wherein the electrical device also contains a layered electrical device, the layered electrical device having a top exterior surface and a bottom exterior surface, the energy unit comprising:
  at least one energy storage device comprising:
    a dielectric material; and
    a first and a second electrical storage conducting layer, wherein the dielectric material lies between the first and second electrical storage conducting layers and at least a portion of at least one of the conducting layers or dielectric material being etched or formed to establish an energy storage value for the energy storage device, the dielectric material being formed between the top exterior surface and bottom exterior surface of the layered electrical device;
  a voltage detector for detecting a potential level of the power source, wherein the voltage detector detects a power source disruption when the voltage detector detects that the potential level of the power source is below a first voltage state;
  a switcher controlled by the voltage detector for disconnecting the power source from the operational load and for connecting the energy storage device to the operational load when the voltage detector detects a power source disruption, whereby the energy storage device provides electrical power to the operational load during the power source disruption.

2. The energy unit of claim 1 wherein the energy storage device is integral to the layered electrical device.

3. The energy unit of claim 2 wherein the layered electrical device is a circuit board.

4. The energy unit of claim 3, wherein the circuit board further comprises at least one circuit conducting layer electrically connected to one of the electrical storage conducting layers.

5. The energy unit of claim 4, wherein the circuit conducting layer comprises at least a portion of either the top or bottom exterior surface of the circuit board.

6. The energy unit of claim 4, wherein the circuit conducting layer is contained within the top and bottom exterior surfaces of the circuit board.

7. The energy unit of claim 3 wherein the dielectric material has a dielectric constant of at least 50.

8. The energy unit of claim 3 wherein the dielectric material is of formula $Ba(a)Ti(b)O(c)$ wherein a and b are independently between 0.75 and 1.25 and c is between about 2.5 and about 5.0.

9. The energy unit of claim 3 wherein the dielectric material is of formula $M(d)Ba(a)Ti(b)O(c)$ wherein "M" is Au, Cu, Ni(3)Al, Ru, or InSn, a and b are independently between 0.75 and 1.25, c is between about 2.5 and about 5.0, and d is about 0.01 to 0.25.

10. The energy unit of claim 3 wherein either the first or second electrical storage conducting layers is a thermal heat sink.

11. The energy unit of claim 3 wherein the energy storage device is a capacitor.

12. The energy unit of claim 3 wherein the energy storage device is a battery.

13. The energy unit of claim 2 wherein the layered electrical device is an integrated circuit chip.

14. The energy unit of claim 13, wherein the integrated circuit chip further comprises at least one circuit conducting layer electrically connected to one of the electrical storage conducting layers.

15. The energy unit of claim 14, wherein the circuit conducting layer is contained within the top and bottom exterior surfaces of the integrated circuit chip.

16. The energy unit of claim 13 wherein the dielectric material has a dielectric constant of at least 50.

17. The energy unit of claim 13 wherein the dielectric material is of the formula $Ba(a)Ti(b)O(c)$ wherein a and b are independently between 0.75 and 1.25 and c is between about 2.5 and about 5.0.

18. The energy unit of claim 13 wherein the dielectric material is of the formula $M(d)Ba(a)Ti(b)O(c)$, wherein "M" is Au, Cu, Ni(3)Al, Ru, or InSn, a and b are independently between 0.75 and 1.25, c is between about 2.5 and about 5.0, and d is about 0.01 to 0.25.

19. The energy unit of claim 13 wherein either of the electrical storage conducting layers is a thermal heat sink.

20. The energy unit of claim 13 wherein the energy storage device is a capacitor.

21. The energy unit of claim 13 wherein the energy storage device is a battery.

22. The energy unit of claim 1 wherein the switcher comprises at least one transistor.

23. The energy unit of claim 1 wherein two or more energy storage devices are connected in parallel.

24. A circuit board, the circuit board connected to an electrical power source, the circuit board comprising:
  a top exterior surface and a bottom exterior surface;
  at least one energy storage device comprising:
    a dielectric material; and
    a first and a second electrical storage conducting layer, wherein the dielectric material lies between the first and second electrical storage conducting layers and at least a portion of at least one of the conducting layers or dielectric material being etched or formed to establish an energy storage value for the energy storage device, the energy storage device being at least partially embedded between the top exterior surface and bottom exterior surface of the circuit board;
  an operational load connected to the power source;
  a voltage detector connected to the power source, for detecting a potential level of the power source, wherein the voltage detector detects a power source disruption when the voltage detector detects that the potential level of the power source is below a first voltage state;
  a switcher controlled by the voltage detector for disconnecting the power source from the operational load and for connecting the energy storage device to the operational load when the voltage detector detects a power source disruption, whereby the energy storage device provides electrical power to the operational load.

25. The energy storage unit of claim 24 wherein the switcher comprises at least one transistor.

26. The energy unit of claim 24 wherein the energy storage device is integral to the circuit board.

27. The circuit board of claim 24 wherein the dielectric material has a dielectric constant of at least 50.

28. The circuit board of claim 27 wherein the dielectric material has a dielectric constant of at least 100.

29. The circuit board of claim 24, wherein the circuit board further comprises at least one circuit conducting layer, the circuit conducting layer residing outside of the energy storage device.

30. The circuit board of claim 29 wherein at least one of the electrical conducting layers is electrically connected to the circuit conducting layer.

31. The circuit board of claim 30 wherein the circuit conducting layer comprises at least a portion of one of the exterior surfaces.

32. The circuit board of claim 29 wherein the second electrical storage conducting layer is also a thermal heat sink.

33. The circuit board of claim 24 wherein the second electrical conducting layer is common to a plurality of electrical storage devices at least partially embedded in the board.

34. The circuit board of claim 24 wherein the second electrical conducting layer is formed with more than one electrically isolated area, whereby different electrical storage devices at least partially embedded within the circuit board can be connected to different voltages.

35. The circuit board of claim 24 wherein the energy storage device is a capacitor.

36. The circuit board of claim 24 wherein the energy storage device is a battery.

37. The circuit board of claim 24 wherein the dielectric material is of formula the Ba(a)Ti(b)O(c) wherein a and b are independently between 0.75 and 1.25 and c is between about 2.5 and about 5.0.

38. The circuit board of claim 24 wherein the dielectric material is of the formula M(d)Ba(a)Ti(b)O(c), wherein "M" is Au, Cu, Ni(3)Al, Ru, or InSn, a and b are independently between 0.75 and 1.25, c is between about 2.5 and about 5.0, and d is about 0.01 to 0.25.

39. The circuit board of claim 24 comprising at least two electric storage devices connected in parallel.

40. An integrated chip comprising, the integrated chip connected to an electric power source, the integrated chip comprising:
   a top exterior surface and a bottom exterior surface;
   at least one energy storage device comprising:
      a dielectric material; and
      a first and a second electrical storage conducting layer, wherein the dielectric material lies between the first and second electrical storage conducting layers and at least a portion of at least one of the conducting layers or dielectric material being etched or formed to establish an energy storage value for the energy storage device, the energy storage device being at least partially embedded between the top exterior surface and bottom exterior surface of the circuit board;
   an operational load connected to the power source;
   a voltage detector connected to the power source, for detecting a potential level of the power source, wherein the voltage detector detects a power source disruption when the voltage detector detects that the potential level of the power source is below a first voltage state;
   a switcher controlled by the voltage detector for disconnecting the power source from the operational load and for connecting the energy storage device to the operational load when the voltage detector detects a power source disruption, whereby the energy storage device provides electrical power to the operational load.

41. The integrated chip of claim 40, wherein the integrated circuit chip further comprises at least one circuit conducting layer, the circuit conducting layer existing exterior to the energy storage device.

42. The integrated chip of claim 40 wherein at least one of the electrical conducting layers is electrically connected to the circuit conducting layer.

43. The integrated chip of claim 40 wherein the dielectric material has a dielectric constant of at least 50.

44. The integrated chip of claim 40 wherein the dielectric material has a dielectric constant of at least 100.

45. The integrated chip of claim 40 wherein the dielectric material is of the formula Ba(a)Ti(b)O(c) wherein a and b are independently between 0.75 and 1.25 and c is between about 2.5 and about 5.0.

46. The integrated chip of claim 40 wherein the dielectric material is of the formula M(d)Ba(a)Ti(b)O(c), wherein "M" is Au, Cu, Ni(3)Al, Ru, or InSn, a and b are independently between 0.75 and 1.25, c is between about 2.5 and about 5.0, and d is about 0.01 to 0.25.

47. The integrated chip of claim 40 wherein the second electrical storage conducting layer is also a thermal heat sink.

48. The integrated chip of claim 40 wherein the second electrical conducting layer is common to a plurality of electrical storage devices embedded within the integrated circuit chip.

49. The integrated chip of claim 40 wherein the second electrical conducting layer is formed with more than one electrically isolated areas, whereby different electrical storage devices embedded within the integrated circuit chip can be connected to different voltages.

50. The integrated chip of claim 40 wherein the energy storage device is a capacitor.

51. The integrated chip of claim 40 wherein the energy storage device is a battery.

52. The integrated chip of claim 40 wherein the switcher comprises at least one transistor.

53. The integrated chip of claim 40 wherein the energy storage device is integral to the integrated chip.

54. The integrated chip of claim 40 comprising at least two electric storage devices connected in parallel.

55. A method for supplying backup power to an electrical device having an operational load and a layered electrical device, the method comprising:
   a) detecting a potential level of an electrical power source providing power to the operational load;
   b) if the potential level falls beneath a first voltage state, switching at least one electrical energy storage device to provide electrical power to the operational load, whereby the electrical energy storage device comprises:
   a dielectric material; and
   a first and a second electrical storage conducting layer, wherein the dielectric material lies between the first and second electrical storage conducting layers and at least a portion of at least one of the conducting layers or dielectric material being etched or formed to establish an energy storage value for the energy storage device, the energy storage device being at least partially embedded between the top exterior surface and bottom exterior surface of the layered electrical device.

* * * * *